United States Patent
Patapoutian et al.

(10) Patent No.: US 9,058,869 B2
(45) Date of Patent: Jun. 16, 2015

(54) APPLYING A BIAS SIGNAL TO MEMORY CELLS TO REVERSE A RESISTANCE SHIFT OF THE MEMORY CELLS

(71) Applicant: Seagate Technology LLC, Cupertino, CA (US)

(72) Inventors: Ara Patapoutian, Hopkinton, MA (US); Antoine Khoueir, Apple Valley, MN (US); Ryan James Goss, Prior Lake, MN (US); Jon D. Trantham, Chanhassen, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 102 days.

(21) Appl. No.: 13/761,301

(22) Filed: Feb. 7, 2013

(65) Prior Publication Data

US 2014/0219001 A1    Aug. 7, 2014

(51) Int. Cl.
*G11C 13/00*    (2006.01)

(52) U.S. Cl.
CPC .................................. *G11C 13/0002* (2013.01)

(58) Field of Classification Search
CPC ............................................ G11C 11/5678
USPC ......................................................... 365/148
See application file for complete search history.

(56) References Cited

U.S. PATENT DOCUMENTS

| | | | |
|---|---|---|---|
| 4,801,948 A | 1/1989 | Kato | |
| 5,657,332 A | 8/1997 | Auclair et al. | |
| 8,156,403 B2 | 4/2012 | Shalvi et al. | |
| 8,467,237 B2 | 6/2013 | Bedeschi et al. | |
| 2004/0264234 A1* | 12/2004 | Moore et al. | 365/148 |
| 2010/0218073 A1 | 8/2010 | Kang et al. | |
| 2012/0248558 A1 | 10/2012 | Gao et al. | |
| 2013/0159796 A1* | 6/2013 | Bedeschi | 714/708 |

FOREIGN PATENT DOCUMENTS

| | | |
|---|---|---|
| JP | 2004185753 | 7/2004 |
| JP | 2006331626 | 12/2006 |
| JP | 2010040090 | 2/2010 |
| JP | 201294234 | 5/2012 |
| KR | 10-2009-0061608 | 6/2009 |

OTHER PUBLICATIONS

Papandreou et al., "Drift-Tolerant Multilevel Phase-Change Memory", $3^{rd}$ IEEE International Memory Workshop, May 2011, 4 pages.
Xu et al., "Using Time-Aware Memory Sensing to Address Resistance Drift Issue in Multi-Level Phase Change Memory", $11^{th}$ International Symposium on Quality Electronic Design, 2010, 6 pages.
Office Action dated Jan. 27, 2015 from Japanese Application No. 2014-021382, 4 pages.
Office Action dated Apr. 1, 2015 from Korean Application No. 10-2014-0012578, 15 pages.

* cited by examiner

*Primary Examiner* — Hoai V Ho
(74) *Attorney, Agent, or Firm* — Hollingsworth Davis, LLC (57) ABSTRACT

Data is written to cells of a resistance-based, non-volatile memory. An activity metric is tracked since the writing of the data to the cells. In response to the activity metric satisfying a threshold, a bias signal is applied to the cells to reverse a resistance shift of the cells.

20 Claims, 6 Drawing Sheets

APPLYING A BIAS SIGNAL TO MEMORY CELLS TO REVERSE A RESISTANCE SHIFT OF THE MEMORY CELLS

SUMMARY

The present disclosure is related to applying a bias signal to memory cells to reverse a resistance shift of the memory cells. In one embodiment, apparatuses and methods facilitate writing data to cells of a resistance-based, non-volatile memory. An activity metric (e.g., passage of time) is tracked since the writing of the data to the cells. In response to the activity metric satisfying a threshold, a bias signal is applied to the cells to reverse a resistance shift of the cells.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same components in multiple figures.

DETAILED DESCRIPTION

In the following description of various example embodiments, reference is made to the accompanying drawings that form a part hereof, and in which is shown by way of illustration various example embodiments. It is to be understood that other embodiments may be utilized, as structural and operational changes may be made without departing from the scope of the claims appended hereto.

The present disclosure is generally related to persistent data storage devices, such as those devices using resistive memory storage. Resistive memories may include any memory that uses persistent changes in resistance of a memory cell in order to store data. Resistive memories may include, but is not limited to resistive random access memory (RRAM or ReRAM) and phase-change memory (PCM). While each of these memory types may have different characteristics and advantages, effective use of memory devices using the different memory types may involve effectively managing physical changes in the media in response to aging of the media and/or based on workload of the media.

The present disclosure relates to compensating for shifts in resistance of resistance based memory over time and/or in view of operating conditions. The compensation may involve any combination of using adaptive error-correction codes (ECC), modifying program and read behavior, using specific data storage formats, and active management of the media. The compensation is intended to increase endurance of the memory, and may have other benefits, such as improved performance. These compensation techniques may be used in combination, and each will be discussed in greater detail below. The techniques may be used in a data storage device, such as the device 100 shown in FIG. 1.

Figure 1:
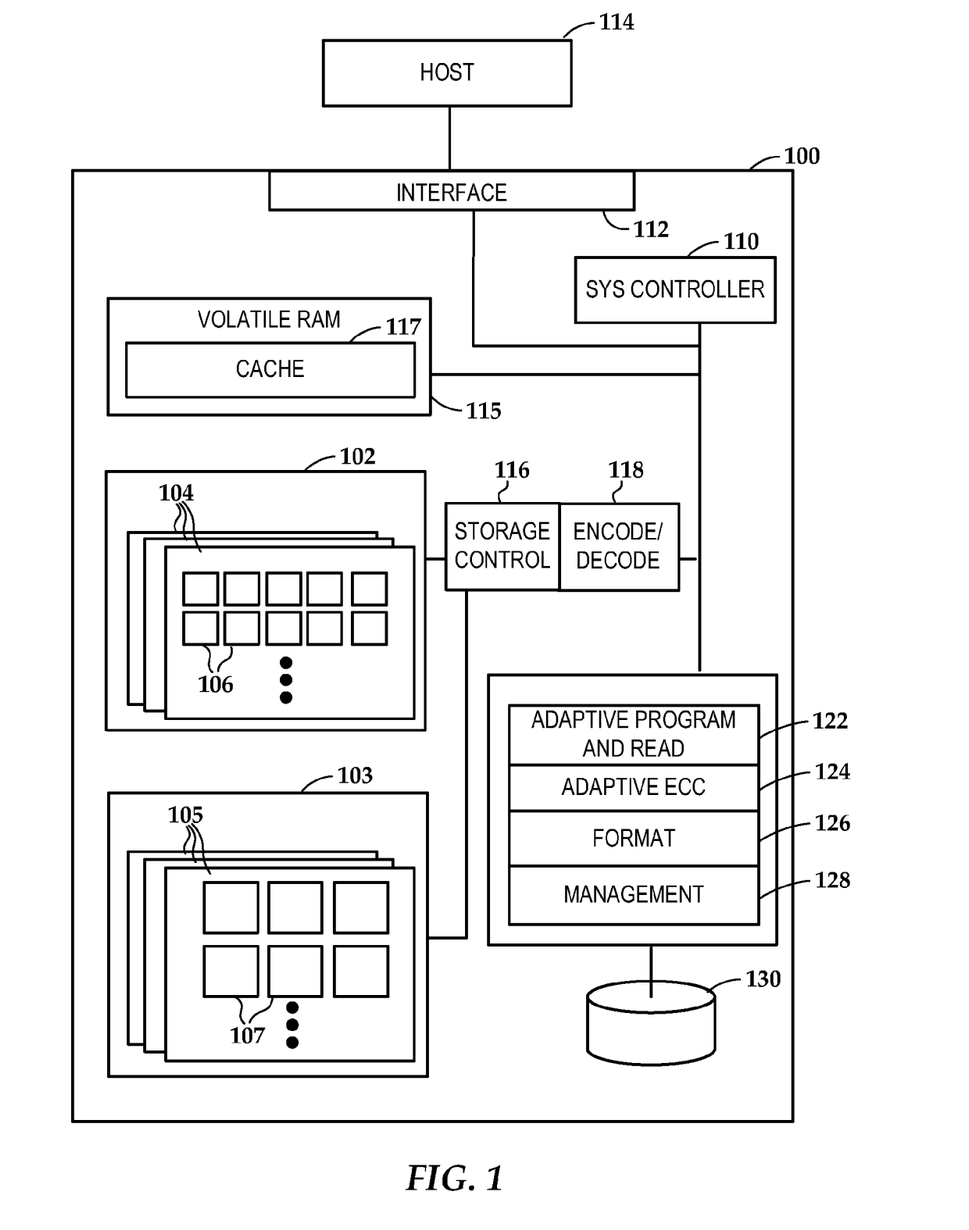
FIG. 1 is a block diagram of a data storage device according to an example embodiment.

In FIG. 1, a block diagram illustrates a data storage device 100 according to an example embodiment. This device 100 may be configured as a solid-state drive (SSD) (or sub-component thereof) that utilizes any combination of solid state memory. The features of the device 100 may be applicable to other types of hard drive devices, such as hybrid drives that use a combination of solid state memory and magnetic disks. The features of the device 100 may also be applicable to special-purpose solid-state and/or disk data storage devices (or sub-components thereof) that do not utilize standard hard drive data interfaces.

The device 100 may include one or more memory units 102, 103 that contain some or all of the non-volatile memory of the device 100. The memory units 102, 103 may include one or more respective discrete physical units 104, 105 e.g., memory chips. In this example, the memory units 102, 103 are non-hierarchical units, and the respective physical units 104, 105 each contain a different type of non-volatile memory storage media from the other. Within each of the physical units 104, 105, the memory may be grouped into smaller blocks 106, 107. Because the underlying media of the physical units 104, 105 are different, the memory sizes of the blocks 106, 107 may differ. While some of the features of the device 100 are applicable to non-hierarchical mixed-media storage, most of the concepts described below may be employed in devices using a single memory unit and/or a single storage media type.

The device 100 may include one or more system controllers 110 that facilitate servicing requests received from a host 114 via a host interface 112. The controller 110 may generally receive read and write requests from the host 114 referencing logical addresses. The system controller 110, among other things, translates the logical addresses to physical addresses, and directs respective read or write operations to be performed on the appropriate physical addresses of the memory units 102, 103.

The device 100 may include volatile random access memory 115 (RAM) that may be used for, among other things, a volatile cache 117 for the non-volatile memory units 102, 103. Generally, the volatile cache 117 is a hierarchical memory structure that mirrors portions of the non-volatile memory 102, 103, but can be read from and/or written to more quickly than the non-volatile memory 102, 103. For some situations, e.g., data that sees repeated read/write activity over a short period of time, the volatile cache 117 will increase performance.

The system controller 110 is coupled to a storage controller 116 that determines and changes states of the media of memory units 102, 103. The storage controller 116 may include logic circuits (e.g., gate arrays, multiplexers) that allow particular memory cells to be selected for reading or writing. The storage controller 116 may also include analog signal processing circuits (e.g., filters, amplifiers) that provide signals used for reading and writing the cells, as well as digital to analog converters (DACs) and analog to digital converters (ADCs) used to translate between the analog information stored in the memory media and the digital information utilized elsewhere in the device.

An encoder/decoder module 118 operates with the storage controller 116 to translate between digital coding formats used by the memory units 102, 103 and user data formats. The encoder/decoder module 118 may be part of the storage controller 116 or a separate unit. If multiple memory units 102, 103 are used, the device 100 may include multiple storage controllers 116 and encoder/decoders 118 that at least performing their respective operations in a way customized for the particular memory types. The separate controllers may also utilize their own logical-to-physical mapping appropriate to the particular memory architecture. In such a case, the system/primary controller 110 may transform a logical host address to an internal logical address usable by the memory units 102, 103.

The primary controller 110 (as well as the storage controller 116 and encoder decoder 118) may operate in response to instructions from memory, logic circuits, firmware or software, represented here as computer-readable media 120 that stores instructions operable by the device 100 to perform operations as described hereinbelow. For example, an adaptive program/read module 122 may alter parameters used by the storage controller 116 when reading or writing to memory units 102, 103. An adaptive ECC module 124 may operate with the encoder/decoder 118 to modify ECC parameters as discussed below.

The computer-readable media 120 also includes a formatting module 126 that may dictate various aspects related to how data is stored within memory units 102, 103. Some aspects of the formatting module 126 may be included within the storage controller 116, such as interleaving of data within particular memory structures. Other aspects of the formatting module 126, such as choosing between different memory units 102, 103 for storing particular data, may be implemented at a higher level, e.g., logical to physical mapping. A management module 128 may also operate at a high-level, e.g., tracking host activity, initiating background processes, etc. The device 100 may include a database 130 that includes a reserved portion of non-volatile memory for data such as usage metrics, configuration settings, etc.

As previously noted, memory units 102, 103 may be configured as non-hierarchical units that contain a different types of memory storage media. For example, the memory units 102, 103 may each include different respective media such as flash memory, resistive RAM (ReRAM), spin-torque RAM (STRAM), or phase-change memory (PCM). For purposes of this disclosure, at least one of the memory units 102, 103 are configured as resistive memory units, e.g., ReRAM and PCM.

Over time, the resistance levels of ReRAM and PCM may shift due to a number of factors, e.g., temperature, material breakdown, number of cycles, retention time, read/write disturb, etc. These resistance shifts can cause decreased endurance. For example, data stored for long periods of time may exhibit significant bit error rate (BER) and/or become unreadable. These errors may become even more pronounced when the memory cell is used to store more than one bit. There are a number of ways to compensate for shifts in resistance, including adaptive ECC and coding, modifying program and read behavior, using specific data storage formats, and active management of the media. These approaches can be used together or individually. Each of them will be discussed in greater detail below.

Adaptive ECC and Coding

Most data storage devices use some sort of error correction to deal with noise and other disturbances that can lead to errors in storing or reading data. For example, an ECC scheme using a linear block code such as a Hamming code adds parity bits to the data when it is written. When the data is read back, the parity bits can be used to detect and correct errors. The strength of the code, generally measured by the number of erroneous bits that can be corrected, generally increases with the number of parity bits used.

In a data storage media, memory cells may be tightly packed together on a die. Therefore activity affecting one cell may influence another cell, e.g., due to current leakage, capacitive coupling, heat, etc. As a result, the type of error seen in a cell, e.g., whether hard-decision threshold resistance value is higher or lower than expected, may be influenced by data written in adjacent cells. The errors may also be influenced by other cell activity, such as reads and writes. An example of this is shown in FIG. 2, which is a block diagram illustrating memory cells 200 that may be used in a device according to an example embodiment.

Generally, rows 202, 203 represent arrangements of physically proximate memory cells. For example, each row 202, 203 may represent a word line, and each block (e.g., block 206) represents memory cell that stores a data symbol of one or more bits. In this example, the memory cells store 2-bit symbols, and each bit within the cell may be part of the same word or different word (e.g., interleaved bits between data words). The concepts described relative to FIG. 2 may be applicable to memory cells that store more or fewer bits.

Figure 2:
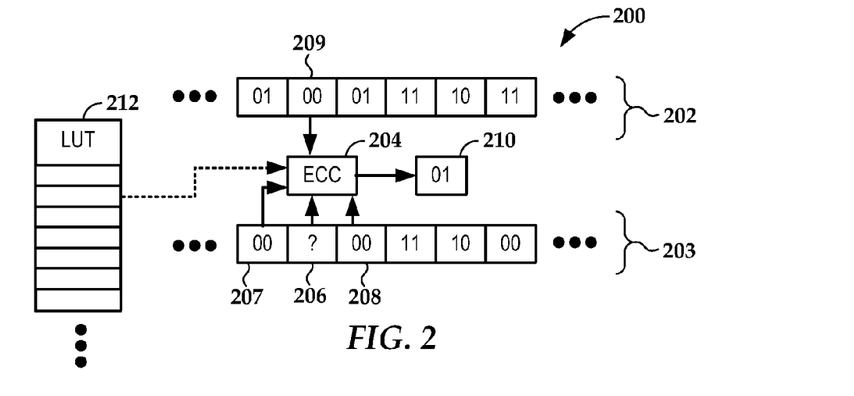
FIG. 2 is a block diagram illustrating decoding data from memory cells according to an example embodiment.

In FIG. 2, an ECC decoder module 204 is used to decode data stored in the memory cells, the result of the decoding being shown in block 210. For purposes of illustration, the decoder module 204 is shown decoding memory cell 206, although in many implementations the decoder module 204 may decode multiple cells (e.g., entire word line 203) simultaneously. Cells 207-209 are physically adjacent to the currently decoded cell 206. Cells 206-208 are part of the same data word or word line, and cells 206, 209 are from different, adjacent data words or word lines. Data in cells 207-209 may or may not be in the same data word as data in cell 206.

For purposes of this discussion, the term "data word" generally indicates a minimum number of bits that are accessed (e.g., written, read, decoded, encoded) together. For example, if the memory is byte addressable, then the memory is configured to read a minimum of one byte (8-bits) of user data at a time. This may involve reading more than 8-bits of stored data from the cells, e.g., user data plus ECC data. Some types of memory, such as flash memory and magnetic disks, may have much larger data words, e.g., sectors or pages equal to or greater than 512 bytes, often 4096 bytes for an SSD. A "word line," in contrast, generally refers to a collection of cells that are physically adjacent and that may be coupled to a common activation line by controller logic. Cells in the same word line may correspond to the same or different data words.

Because the values stored in adjacent cells 207-209 may affect the value read from cell 206, it may be desirable to use adjacent bit states as prior information for error correction. Error correction codes such as low density parity check (LDPC) may show improved performance by supplementing channel information with the prior, or side information provided by the auxiliary cells. In telecommunications systems, the prior information may be obtained from a prior transmission of the same data (e.g., retransmission of an unrecoverable block of data). In the illustrated embodiment, the prior information may be obtained by the value of neighboring bits 207-209.

Generally, through processes such as read or write disturb, neighboring bits interfere with bits of interest in at least a partly deterministic manner. For example, if a cell is programmed to a desired level by applying a relatively high voltage of a given polarity, this may affect neighboring cells that have been programmed to a level that uses a lower voltage and/or a voltage of different polarity. Specifically, there is a possibility that the resistance of the cells has been shifted in the direction induced by the neighboring cell programming levels (or read levels, in some cases).

In the illustrated example, the value read from cell 206 has low confidence or cannot be determined. If values of neighboring cells 207-209 are known, these values may be used as prior information to be used in the first or subsequent attempts at decoding cell 206, which may be performed as part of the decoding of the entire word line 203. While the value of cell 209 might only be known if word 202 was already decoded and buffered (e.g., held in a DRAM cache), such a scenario may occur in some situations, e.g., large sequential data reads.

Assuming the cells 206-208 are all part of the same encoded word, the values of cells 207 and 208 might not be known to a high level of confidence until unknown values such as cell 206 are determined. Nonetheless, the current hard decisions in cells 207, 208 may still be useful, such as if the estimated data in those cells 207, 208 fits a pattern. For example, all the neighboring cells 207-209 in this example are at value '00', and such a situation may be known to cause read or write disturb that influences neighboring cell errors in a particular direction. Adjusting the read of cell 206 in that direction may both confirm the values of cells 207, 208 as well as determine the value of cell 206 to a higher level of confidence.

The arrangement in FIG. 2 may also use a compressed look up table (LUT) 212 usable by the ECC decoder 204. The LUT 212 provides for soft information that feeds into the ECC decoder 204, and the same LUT 212 can be used for a plurality of locations. The soft information may be used for giving predicted likely-hood of correct bits. The LUT 212 can be pre-populated at a manufacturing time by using a test/validation process to compute the disturbance effects. The LUT 212 can also be updated run-time to adjust for actual measured values in the device. For example, previously successfully decoded data can be used to characterize disturbances, e.g., compare uncorrected data to corrected data. Generally, the LUT 212 is compressed in that it at least has a memory footprint smaller than a footprint of ECC parity that it replaces.

The LUT 212 can also be created for specific locations in the memory (e.g., edge locations may differ from central locations on the die). The LUT 212 can also be filled with data from the previous read in a neighboring location. This can be used for pre-compensation when performing sequential reads. If it is known the last page was corrected (and possibly that such correction was difficult), then that correction information can be used later. Correction information can serve as a starting point for reading subsequent pages, because it may be more likely errors in the next pages would be due to shift in the same manner as the last page.

Figure 3:
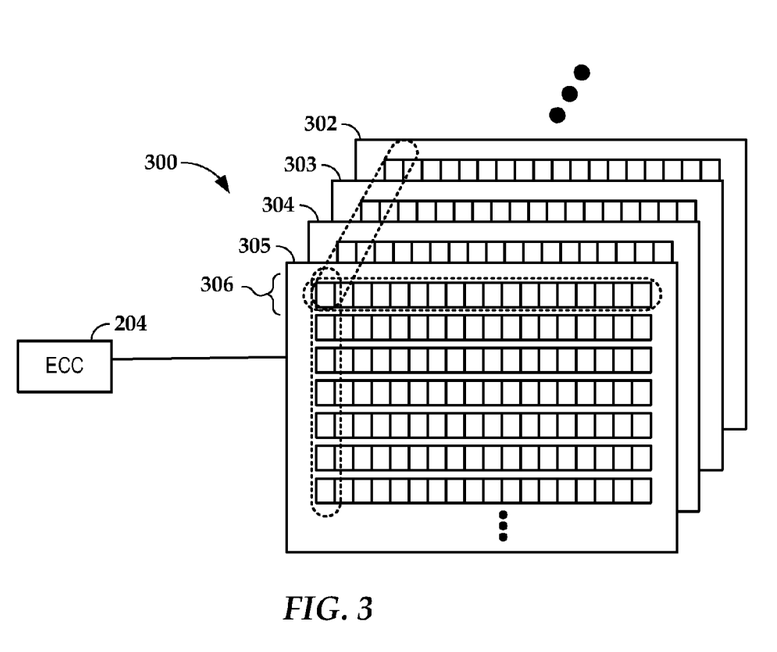
FIG. 3 is a block diagram of a memory arrangement according to an example embodiment

The diagram in FIG. 2 represents an example of using other cell states/values to assist in error correction of a neighboring cell. This may be extended further as shown in FIG. 3, which includes a block diagram of a memory arrangement 300 according to an example embodiment. The memory arrangement 300 includes multiple physical components (e.g., layers, chips, etc.) each having a plurality of arrays. The rows of the arrays (e.g., row 306) may represent individually addressable regions such as data words, pages, or groups thereof. An ECC module 204 may compute error codes across multiple dimensions as indicated by the dashed regions, e.g., across multiple pages and/or multiple components. This may involve generally categorizing errors that are particular to the memory device 300, and applying corrections to individually addressable regions 306, particular components 302-305, or to the device 300 as a whole.

In one arrangement, the memory device 300 may be characterized during manufacture to develop transfer functions usable in encoding and decoding of cell data. This may include reducing advertised capacity of the device 300 in order to utilize greater amounts of ECC. Additional scalars may be applied during run time by tracking, re-characterizing and/or predicting degradation based on run-time factors. These additional scalars may account for effects that cannot be determined at the manufacturing phase, such as additional degradation caused by integration with other functional components, environment, etc.

In addition to the above described multi-dimensional ECC, an apparatus according to an example embodiment may include additional features to deal with errors particular to resistive memory types. For example, an ECC encoder/decoder arrangement may be able to use a variable code rate ECC. The arrangement (e.g., via adaptive ECC module 124 shown in FIG. 1) could identify regions of memory and/or system states that are more likely to result in errors. These indicators could be used to select a higher level of ECC (via encoder/decoder module 118 in FIG. 1) for those regions and/or situations to adaptively reduce unrecoverable errors.

An ECC encoder/decoder may be configured to vary the code rate as memory cells degrade. Different levels of ECC may be applied on particular regions, or the same variable ECC may be applied across an entire memory unit of the same type. The storage device may be configured (e.g., via management module 128 in FIG. 1) to do a background scan, and detect that the error rate is approaching a set correction capability. In response, additional correction codes can be calculated and used either locally or globally for newly written data.

In another example, dynamic ECC codes may be applied based on data type or current activity of the data. In such a case, large ECC code words may be used for sequential data and/or cold data, and small ECC code words may be used for random/hot data. Because hot data (and in some cases random data) may be frequently or unpredictably rewritten, it may be less susceptible due to long term data retention errors, and therefore can use smaller ECC. Also, smaller ECC may lead to improved throughput or latency performance of that random or hot data.

In another example, a data storage device may use smaller boundaries for encryption/coding/scrambling, and enable ECC to be adjusted for smaller partitions of data. For example multiple seeds may be available, and the seed that minimizes the number of bits that need to be altered is chosen. Data can be encrypted at a smaller granularity so that only the necessary sections of the data that actually changes need to be updated.

In another example, the ECC data may be capable of being stored separately from the user data it is protecting. In such a case, the ECC may be stored in one of the memory units 102, 103 and the user data stored in another of the units 102, 103. For example, ECC may be stored in a high endurance memory type if there are more ECC updates compared to data updates.

In another arrangement, the memory units 102, 103 include at least some multiple level cells. In such a case, reading the value stored in a cell involves distinguishing between more than one resistance threshold level. If the cell stores two bits, for example, a storage controller and/or decoder would have to determine whether the stored resistance is within one of four regions.

Four regions can be defined by three threshold levels that partition the four regions. In one example, a coding scheme could be utilized to guarantee a minimum number of bits are stored at each threshold level and use info to compensate thresholds. In such a case, the knowledge of encoding MLC bits can help to provide another check of the integrity of the data. If a group of single-level bits are retrieved that were scrambled evenly during coding, they will have even parity on being read back. This can provide a check whether or not the data is correct.

In MLC memory (e.g., a cell storing two or more bits) this "even" encoding may involve an even distribution of symbols (e.g., "00," "01," "10," and "11" for two-bit MLC). When a block of data is read back, significant skews affecting one particular symbol can provide a clue of what type of errors are being seen. Using the two-bit example, assume a page of 1024 bits is read back as follows: 256 instances of symbol "00"; 250 instances of symbol "01"; 240 instances of symbol "10"; and 278 instances of symbol "11". In this case, there is a significant deviation with too many bits in the "11" state and too few in the "10" state, and this can be used to focus on what compensation might be most effective for this particular type of error.

Similarly, some memory storage media (e.g., PCM) may exhibit fixed pattern effects. For example, if long series of ones or zeros are stored, this could lead to localized heating, predictable disturb patterns, etc. An encoding scheme could be utilized that scrambles the data, e.g., increases randomness of the data so that probability of fixed patterns are reduced. This reduction in patterns is sometimes a natural result of compression schemes, although the encoding scheme need not compress the data in order to achieve the desired scrambling.

Adaptive Program and Read

Figure 4:
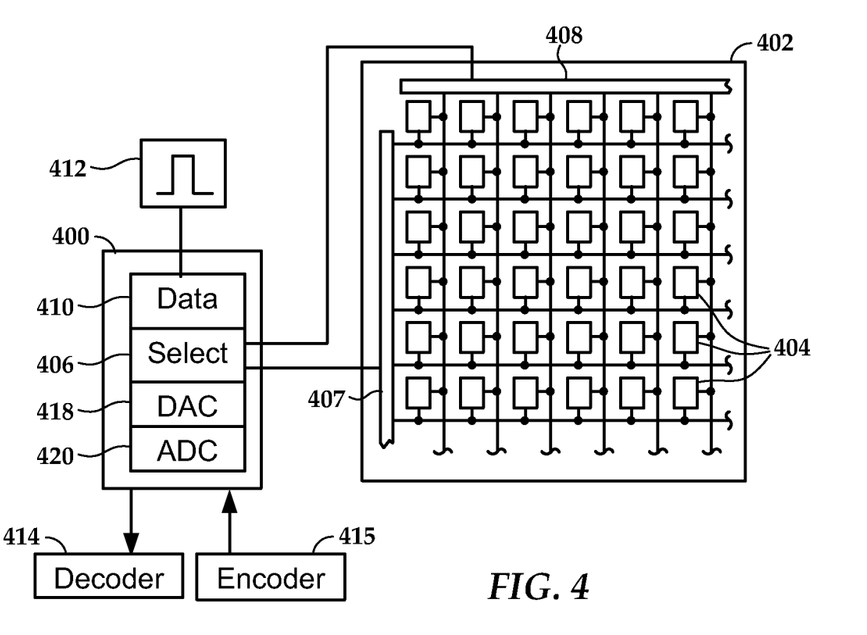
FIG. 4 is a block diagram of a storage controller according to an example embodiment.

In reference now to FIG. 4, a simplified block diagram illustrates aspects of a storage controller 400 according to an example embodiment. Generally, the storage controller 400 includes circuits used to select and apply signals to memory cells 404 of array 402. A selection module 406 selects individual cells 404 for programming or read operations. In this example, the cells are activated by way of row lines 407 and column lines 408. A data module 410 applies signals (e.g., square wave 412) to a data line during program or read operations. The data line could be one of the row lines 407 or column lines 408, or be configured as a separate line (not shown). The signal 412 can change a state of the cells 404 (program) and/or be used to detect a current state of the cells 404 (read).

The storage controller 400 is coupled to a decoder 414 and encoder 415 that respectively receive and send signals to the storage controller 400. The storage controller 400 may include a 418 DAC that turns digital data from the encoder 415 to an analog signal that is applied to program the cells 404. The storage controller 400 may also include an ADC 420 to covert signals read from the cells to a digital format used by the decoder 414. The data provided to the decoder 414 from the storage controller 400 may include hard data, which includes '0' and '1' values estimated from reading the memory cells 404. The data provided to the decoder 414 from the storage controller 400 may also or instead include soft data, which is a range estimating the data symbols stored in the memory cells 404. Soft data can be used to determine the hard decisions, and also includes a measure of confidence of decision, which assists the decoder 414.

Due to usage and the passage of time, the cells may tend to exhibit errors caused by drifts in the resistance values of the cells, or other differences in behavior. The storage controller 400 may change program and read operations to compensate for these changes. For example, if the memory cells 404 are PCM cells, the storage controller 400 may change the way a PCM programming algorithm works via the storage controller as the cells 404 age.

Generally, PCM cells change from an amorphous to crystalline state upon the application of a particular voltage, and the resistance is measurably different between those states. As the cells age 404 (either as measure by duty cycles or the passage of time), the transitions between states may not occur as reliably. In such a case, rather than applying rectangular or trapezoidal pulse, the data module 410 may apply pulses in alternate shapes. For example, the leading edge or trailing of the waveform may have a more gradual slope and have less sharp transitions. This may optionally involve changing a program time of the cell 404.

In some cases, the storage controller 400, may be able to avoid reprogramming particular cells unless necessary. For example, the storage controller 400 may be able to address individual cells 404, and be able to determine what is currently stored in a cell. In such a case, a request to program a group of cells 404 (e.g., minimum sector or page size addressable by the host) may only require programming a subset of the cells. This reduction in the amount of programming involved may aid in avoiding disturb on the neighboring cells.

In another example, current errors detected while reading cells 404 may be used as input when reading additional cells at the same time. For example, in sequential programming errors detected in previous reads may be used to help predict how much the subsequent thresholds need to be shifted. This may involve shifting read thresholds to correct for read errors in stored data, and/or shifting write thresholds to compensate for the detected read errors when such data is later read back. Data produced by the ADC 420 may be used for improvement of uncorrectable bit error rate (UBER). For example, in error recovery, the ADC 420 built into the storage controller 400 is used to get soft info.

The state of a resistive memories can be obtained with a single read, and so the n-bit ADC value itself can be used to provide the soft information, where the value of 'n' is only limited by the accuracy and/or precision of the ADC. This is in contrast to flash memory, where multiple reads of an individual cell are sometimes used to obtain soft data, e.g., three reads of the flash memory are used to get two bits of soft information. While the ADC values may also be used when reading from flash memory, due to the large page sizes (e.g., 1-8 KBytes) this may involve transferring and handling a prohibitive amount of data when reading a page. In contrast, if a resistive memory unit uses smaller addressable units, then providing the ADC values may not be prohibitive.

The arrangement shown in FIG. 4 may also be used to adjust read levels used by the storage controller 400. For example, a system controller (e.g., controller 110 and/or adaptive program/read module 122 in FIG. 1) may actively track workload metrics such as read/write cycles, retention, read or write activity levels, and temperature. The system controller may also track other metrics such as endurance, throughput, latency, e.g., that may be inherent to a particular type of memory. The system controller may be configured to actively change the resistance read level, via the storage controller 400, as a function of these metrics.

Figure 5:
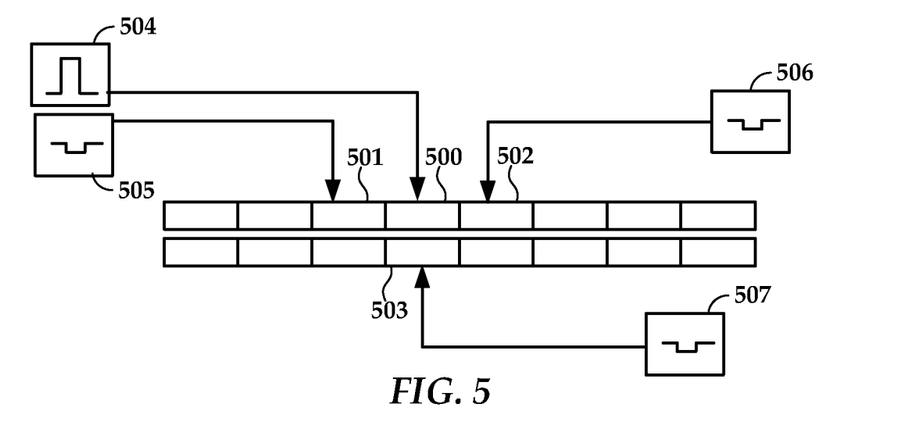
FIG. 5 is block diagram of a storage controller using read and/or program signal values to adjust for read or write disturb effects according to an example embodiment.

In reference now to FIG. 5, a block diagram illustrates how a storage controller may adapt read or program signal values to adjust for read or write disturb effects. Cells 501-503 are proximate cell 500 that is currently being programmed, as represented by signal 504. Signals 505-507 represent signals applied to cells 501-503 to compensate for the programming operation affecting cell 500. These signals 505-503 may be applied by partially re-writing the data in cells 501-503 to adjust them for the shift (for program disturb). In another scenario, e.g., where all of cells 500-503 are being programmed contemporaneously, the signals 505-507 may be added as pre-compensation to other signals (not shown) used to currently program written data to cells 501-503. In such a case, the signal 504 may already include compensation for values that just have been or soon will be programmed to cells 501-503.

Programming the data may also involve a read modify write within a given/prescribed refresh time based on noise margin or other metric that is detected to decide whether to refresh or not. Using compensation prediction as described herein, a time can be determined of when data in the memory becomes degraded. The predictions can be used to re-write the data prior to the data becoming so degraded that it can't be recovered. However, this must be balanced with endurance wear out of the cells, which can be exacerbated if the cells are re-written too often. If a controller predicts that a cell is degraded, it may first read the cell to determine if the prediction is accurate (e.g., via ECC and/or ADC values). If the prediction is accurate, then the controller may re-write or move the data. If the prediction is wrong, then the error can be fed back into a database to adjust subsequent predictions.

In one embodiment, a grid of transfer functions may be used to determine the compensation for each of cells 500-503, as well as any other cells involved in the programming operation, or close neighbors thereof. In another embodiment, neighboring cells may be re-read to see if they have to be adjusted. This may be used for adjacent word lines, and may involve looking at actual threshold values, ECC, and/or soft read data. Although the illustrated embodiment shows compensation for one immediately proximate cell. This may be applied to multiple cells, e.g., decaying the compensation as a function of distance from the programmed cell. Such compensation could be calculated for all cells in a block of data being written so that particular signal levels used to program a particular symbol may have a wide range of values depending on neighboring data being written.

Formatting

As previously described, physical adjacency between resistive memory cells can cause disturb effects when neighboring cells are read and/or programmed. A memory storage device may include features as described above to detect and compensate for such effects. Additional measures may be taken to minimize disturb effects. In particular, the logical pages can be arranged in physical memory locations that minimize fixed disturb patterns. The data may be arranged by one or both of adaptive logical-to-physical mapping and adaptive arrangement of data blocks for storage in physical memory cells.

Figure 6:
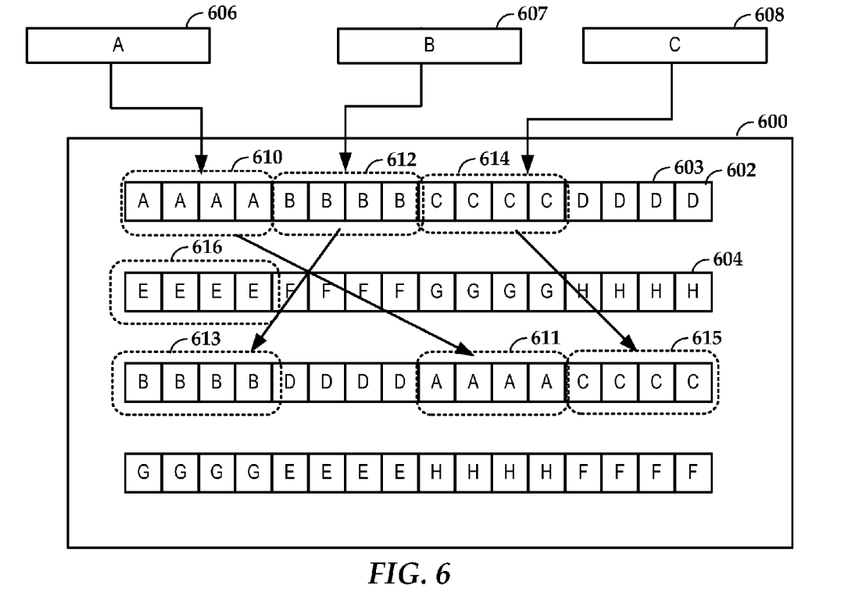
FIG. 6 is a block diagram illustrating an example of interleaving logical blocks into physical location according to an example embodiment.

In reference now to FIG. 6, a block diagram illustrates an example of interleaving logical blocks into physical location according to an example embodiment. Block 600 represents a portion of a memory storage media, such as a RRAM or PCM array. For purposes of this example, it may be assumed that cells vertically and horizontally adjacent to each other may disturb each other. For example cells 603 and 604 are both adjacent to cell 602. The vertical and horizontal spacing may be the same or different, and the disturb effects may be proportional to the spacing and/or other physical properties of the cells.

Blocks 606-608 represent logical blocks, e.g., words, pages, sectors, etc. The data for each block 606-608 is stored in eight cells of the storage media 600. Each cell may store a single bit or multiple bit symbol. The letters in each of the cells indicate a logical block that stores data in the cell. For example, cells in regions 610 and 611 are annotated with the letter "A," indicating they store data for logical block 606. Letters "B" and "C" in regions 612-615 indicate association with logical blocks 608 and 608, respectively. Letters "D"-"H" in other cells indicate data of other logical blocks (not shown).

The regions 610-615 are interleaved so that disturb effects associated with reading or writing logical blocks 606-608 will be spread out amongst other pages. This may tend to alleviate fixed pattern effects, such that writing to block 606 affects only a few symbol of another block that is directly adjacent along a row or a column. The interleaving shown in this example ensures a word shares no more than four vertically adjacent cells with another word, and shares no more than one horizontally adjacent cell with another word. This example is not intended to be optimal for all situations, and many variations may be possible. For example, instead of grouped in blocks of four as shown, cells of a logical block 606 may be individually dispersed in the storage media 600. Further, if the cells are multiple bit cells, the bits within each cell may be shared between two or more different logical blocks.

In another example, multiple logical blocks (e.g., blocks 606-608) may be grouped into a common set that are modified in a set order. For example, the eight logical blocks that store data in the illustrated media 600 may be written in such an order that activity is dispersed in different physical regions. This may prevent build-up of heat or other effects (e.g., electrical charge) that may aggravate disturb affects.

The interleaving and grouping discussed above in reference to FIG. 6 may be achieved in a number of ways. For example, a logical to physical mapping may indicate the location of one or more cell groups as shown in FIG. 6. This may be performed by a formatting module 126 as shown in FIG. 1. The interleaving may be performed by a storage controller (e.g., storage controller 116 in FIG. 1), or by the structure of the memory itself. The interleaving may be fixed, such that a logical block associated with region 610 is always associated the region 611. The interleaving may be variable, such that any two or more regions may be associated with different blocks.

Figure 7:
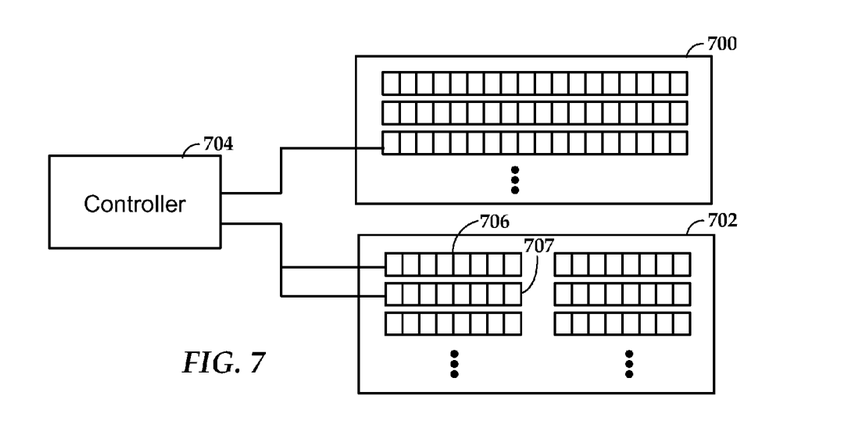
FIG. 7 is a block diagram of a memory device that includes regions having different types or configuration of memory.

As previously described in relation to FIG. 1, a memory device may include regions having different types or configuration of memory. One example of this is shown in FIG. 7, where memory units 700, 702 may be written to and read from by a controller 704 (e.g., using formatting module 126 shown in FIG. 1). Memory units 700, 702 may be of a different or same memory type, however have different storage unit sizes, e.g., physical block or page sizes. In this example, memory unit 702 has a minimum page size of N, and memory unit 700 has a minimum page size of 2N. If the minimum logical block size also corresponds to 2N, then one page of memory unit 700 may store a logical block, and two pages of memory unit 702 are used to store one logical block.

The controller 704 may select one of units 700 and 702 for storage of data depending on how the data may be used. For example, if data is expected to be randomly updated, then it may be more efficient to store the data in the unit 702 with smaller page sizes. So if a logical block of data is determined to be random, it can be stored in pages 706, 707 of block 702. If it can be determined (e.g., via an existing entry in a volatile cache) that only part of a page has been changed by a host command, then it may be that only one of blocks 706, 707 needs to be rewritten. Such a selection may depend on other factors, such as relative latency and throughput of units 700, 702, whether pages in unit 702 can be written in parallel, relative power consumption required to program pages of units 700, 702, etc.

The controller 704 may also utilize other system data to dictate where data is stored in one or both memory units 700, 702. For example, the controller may be able to track both wear within the units 700, 702, as well as workload metrics such as whether data is hot or cold. In such a case, the most worn blocks of memory units 700, 702 may be selected to get the coldest data.

The controller 704 may also periodically reallocate bad units (for example word lines) and retire bad units. This may also involve re-characterizing inherent metrics such as reliability. For example, if two physical pages are insufficiently reliable to store the advertised page size, their advertised capacity may be halved and they could be combined into a single logical unit with a greatly increased ECC code.

Management

Some operations of a device may occur somewhat independently of host command. For example, flash memory devices may perform what is known as garbage collection, where blocks of old data (e.g., data that has been deleted or modified, the latter involving marking the block of data as stale and writing the modified data elsewhere) are erased for reuse in writing new data. Garbage collection may occur in the background, e.g., when host activity is low. For resistive memory, particular operations may be undertaken that are independent of a host request, such as timed operations that may occur in the background or during periods of low activity.

Figure 8:
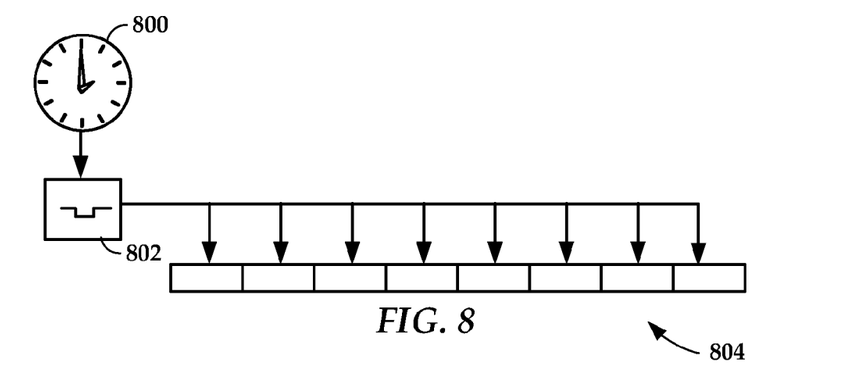
FIGS. 8-9 are block diagrams illustrating application of a bias signal to memory cells to compensate for a resistance shift of the memory cells according to an example embodiment.

A background activity that may be performed in a resistive memory device according to an example embodiment is shown in the block diagram of FIG. 8. Based on a timer 800, a storage controller or similar device (e.g., storage controller 116 and/or system controller 110 in FIG. 1) applies a bias signal 802 to a plurality of resistance based memory cells 804. The bias signal 802 reverses activity-based effects that tend to shift resistance values of the cells. The storage controller may include custom circuitry or instruction that facilitate applying the bias signal 802, which may be different than read/write signals normally applied to the memory cells to read or write data.

The timer 800 may track run time and/or date/time (e.g., via an onboard and/or host clock). The time provided by the timer 800 is only one activity metric that may be tracked by the device to trigger application of signal 802 to the cells 804. The time may be augmented or adjusted by other factors, such as ambient temperature or read activity since the last write operation. In another example, system activity such as accessing of target cells or neighboring cells may be used instead of the passage of time to trigger application of signals 802 to the cells 804.

The bias 802 signal dynamically adjusts for resistance shift by applying a certain bias on the device. If the memory cells 804 are PCM memory, conductivity changes since the material migrates from crystalline to amorphous state over time. In such a case, the cells 804 may be kept in a crystalline mode by applying a small bias that will result in localized temperatures between the melting temperature and crystalline temperatures.

If the cells 804 are RRAM, the signal 802 may have a polarity that counteracts ion migration from the cells. A storage controller can adjust the amount of oxygen ion diffusion between two materials by changing the bias and pulse time of the signal 802. Also, regardless of the memory type, the applied signal may be different for each cell or group of cells depending on a state, total age, workload history, or other aspect. An example of a differentiated signal is shown in the block diagram of FIG. 9.

Figure 9:
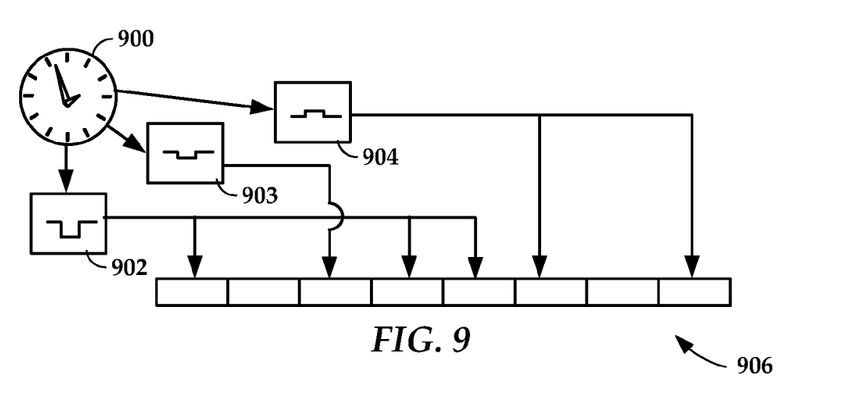

Based on a timer 900, a storage controller or similar device applies a plurality of signals 902-904 to a plurality of resistance based memory cells 906. The bias signals 902-904 reverse activity-based effects that tend to shift resistance values of the cells, with each signal level, duration, polarity, etc. chosen based on a combination of factors, such as retention time, data written to the cells, environmental factors, etc. Some cells may not have any signal applied. The type of signal applied to the cells 906 may be re-evaluated as workload of the cells change.

The timer 900 may track run time and/or date/time (e.g., via an onboard and/or host clock). The time provided by the timer 900 is only one activity metric that may be tracked by the device to trigger application of signals 902-904 to the cells 906. The time may be augmented or adjusted by other factors, such as ambient temperature or read activity since the last write operation. In another example, system activity such as reading of target cells or neighboring cells may be used instead of the passage of time to trigger application of signals 902-904 to the cells 906.

The characterization of cells as described above may involve tracking both workload of the cells, as well as particular performance aspects of the cells themselves (e.g., error rates). However, this may involve performing data reads, which may be done in response to a host request. If data has not been read in some time, then the device may have to initiate reading of example regions to characterize current condition of the cells without such a request from the host. However, obtaining metrics regarding current condition (e.g., amount of resistance shift seen in the cell) may be based on high confidence in the reading the data, which may not be known beforehand.

Figure 10:
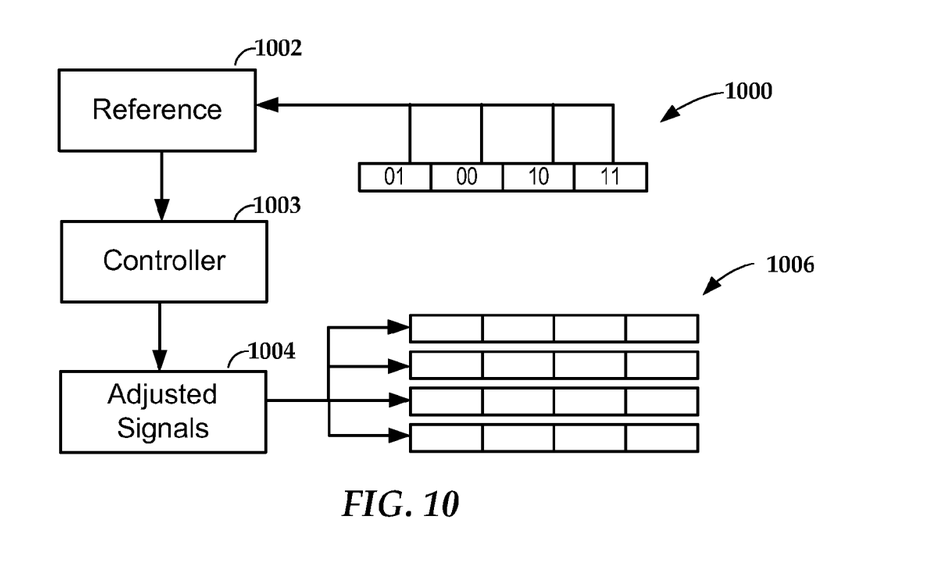
FIG. 10 is a block diagram of an arrangement that utilizes known patterns to characterize cell degradation.

In reference now to FIG. 10, a block diagram illustrates an arrangement that utilizes known patterns to characterize cell degradation. Reference memory cells 1000 store a known pattern, which may include a fixed pattern or pattern that can be calculated based on other information, and may include user data. The reference memory cells 1000 may be strategically dispersed throughout the memory units of a device. The reference cells 1000 may be periodically read by a reference module 1002. The reference module 1002 may be part of a storage controller 1003, and may perform functions outside of the normal read/write activity. In this example, the reference module 1002 may compare the known/derived data in reference cells 1000 with measured thresholds of the reference cells 1000. The measured thresholds may have higher resolution than what is used to decode user data, and/or may be repeatedly sampled to statistically characterize the readings. The measured thresholds can be used to estimate resistance shifts of other cells storing user data.

The resistance shift data determined by the reference module 1002 may be stored (e.g., in memory registers or via database 130 in FIG. 1) in order to adjust read or write operations of other memory cells 1006 that store user data. The controller 1003 may include or control a module 1004 that adjusts signals (e.g., voltages, timing) used in reading from or writing to the cells 1006. For example, the signal adjusting module 1004 may include memory registers that are accessed by a DAC that creates programming signals/waveforms. The DAC accesses the register to obtain parameters of the waveforms when programming particular data values to cells.

Resistance shift data may be used when periodically applying bias signals to cells as shown in FIGS. 8 and 9. For example, a number of reference cells 1000 may be rewritten at various times to estimate aging effects of cells having different retention times and/or access patterns. Based on retention time or access history of target user data cells 1006, a reference cell 1000 is chosen having the closest corresponding retention time or access history. A resistance shift of the reference cell 1000 is used as an estimate for the target cells 1006, and the resistance shift is used to choose values for a corrective bias signal (e.g., signal 802 in FIG. 8) applied to the target cell 1006.

Figure 11:
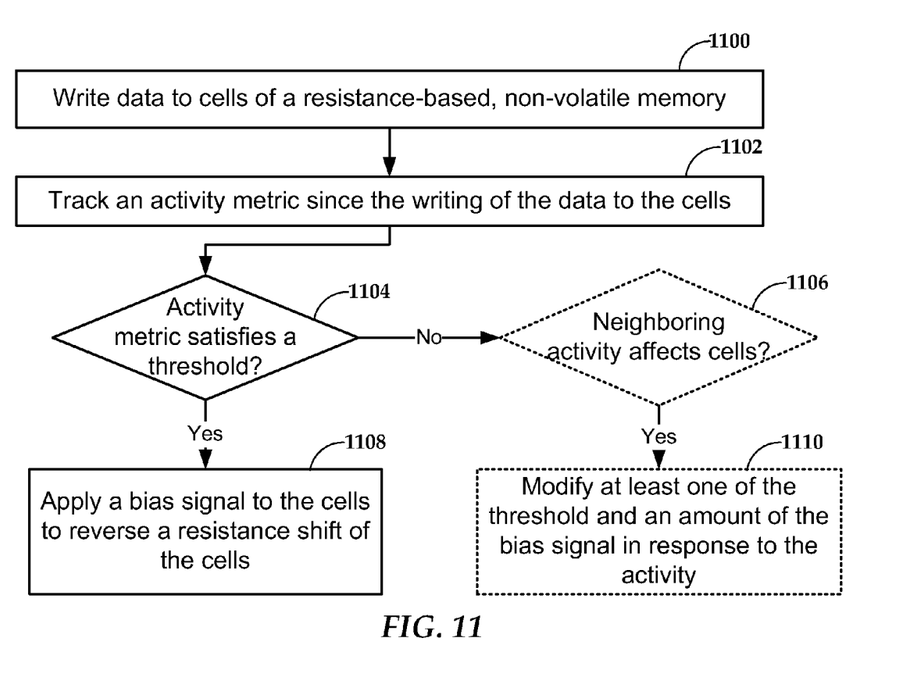
FIGS. 11 and 12 are flowcharts of methods according to example embodiments.

In reference now to FIG. 11, a flowchart illustrates a method according to an example embodiment. The method may be used for application of a bias signal to memory cells to compensate for a resistance shift of the memory cells as shown in FIGS. 8 and 9. The method involves writing 1100 data to cells of a resistance-based, non-volatile memory and tracking 1102 an activity metric (e.g., elapsed time, temperature, read requests) since the writing of the data to the cells. If it is determined 1104 that the activity metric satisfies a threshold, a bias signal is applied 1108 to the cells to reverse a resistance shift of the cells. Optionally, if the activity metric does not satisfy the threshold, it may be determined 1106 whether neighboring activity metrics have affected the cells of interest. If so, one of the threshold determined at 1104 or bias signal applied at 1108 may be modified 1110.

Figure 12:
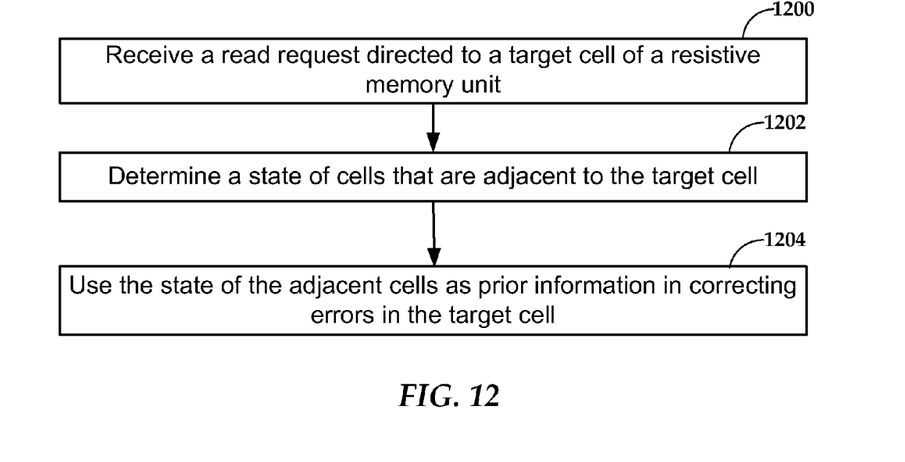

In reference now to FIG. 12, a flowchart illustrates a method according to an example embodiment. The method may be used for using adjacent cell state for error correction as shown in FIGS. 2-4. The method involves receiving 1200 a read request directed to a target cell of a resistive memory unit. A state of the cells that are adjacent to the target cell are determined 1202. The adjacent cells may be of the same logical block that is the subject of the request, or a different logical block. The state of the adjacent cells is used 1204 as prior information in correcting errors in the target cell.

The various embodiments described above may be implemented using circuitry and/or software modules that interact to provide particular results. One of skill in the computing arts can readily implement such described functionality, either at a modular level or as a whole, using knowledge generally known in the art. For example, the flowcharts illustrated herein may be used to create computer-readable instructions/code for execution by a processor. Such instructions may be stored on a computer-readable medium and transferred to the processor for execution as is known in the art. The structures and procedures shown above are only a representative example of embodiments that can be used to facilitate managing caching in data storage devices as described above.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. A method comprising:
    writing data to cells of a resistance-based, non-volatile memory;
    tracking an activity metric since the writing of the data to the cells;
    tracking a second activity metric of neighboring cells;
    in response to the activity metric satisfying a threshold, applying a bias signal to the cells to reverse a resistance shift of the cells; and
    in response to the second activity metric of the neighboring cells, modifying at least one of the threshold and an amount of the bias signal.

2. The method of claim 1, wherein the activity metric comprises at least one of an elapsed time, a temperature, and a number of read operations targeted to the cells.

3. The method of claim 1, wherein a polarity of the bias signal is the reverse of a programming signal polarity used on the cells.

4. The method of claim 1, wherein the cells comprise phase change memory cells, and wherein the bias results in keeping the cells in a crystalline state.

5. The method of claim 1, wherein the cells comprise resistive random access memory (RRAM) cells, and wherein the bias results in reversing an ion migration.

6. The method of claim 1, further comprising tracking an age of the cells, and wherein at least one of the threshold and an amount of bias signal is modified in response to the age.

7. The method of claim 1, wherein the tracking of the elapsed time and the applying of the bias signal is performed repeatedly over a life of the resistance-based, non-volatile memory.

8. The method of claim 1, further comprising:
    determining resistance shift data from a reference cell of the resistance-based, non-volatile memory that stores a known data pattern; and
    estimating the resistance shift of the cell based on the resistance shift data of reference cell.

9. An apparatus comprising:
    a controller configured to read from and write to in a resistance-based, non-volatile memory unit, the controller configured to perform:
        writing data to cells of the resistance-based, non-volatile memory unit;
        tracking an activity metric since the writing of the data to the cells;
        tracking data access activity of neighboring cells;
        in response to the activity metric satisfying a threshold, applying a bias signal to the cells to reverse a resistance shift of the cells; and
        in response to the data access activity of neighboring cells, modifying at least one of the threshold and an amount of the bias signal.

10. The apparatus of claim 9, wherein the activity metric comprises at least one of an elapsed time, a temperature, and a number of read operations targeted to the cells.

11. The apparatus of claim 9, wherein a polarity of the bias signal is the reverse of a programming signal polarity used on the cells.

12. The apparatus of claim 9, wherein the cells comprise phase change memory cells, and wherein the bias results in keeping the cells in a crystalline state.

13. The apparatus of claim 9, wherein the cells comprise resistive random access memory (RRAM) cells, and wherein the bias results in reversing an ion migration.

14. The apparatus of claim 9, wherein the controller further performs tracking an age of the cells, and wherein at least one of the threshold and an amount of the bias signal is modified in response to the age.

15. The apparatus of claim 9, wherein the controller further performs:
   determining resistance shift data from a reference cell of the resistance-based, non-volatile memory unit that stores a known data pattern; and
   estimating the resistance shift of the cells based on the resistance shift data of the reference cell.

16. An apparatus comprising:
   a resistance-based, non-volatile memory unit;
   a storage controller configured to apply a bias signal to cells of the memory unit, the bias signal differing from signals applied to read and write to the cells;
   a system controller coupled to the storage controller and configured to perform:
      writing data to the cells via the storage controller;
      tracking an elapsed time since the writing of the data to the cells;
      tracking data access activity of neighboring cells;
      in response to the elapsed time satisfying a threshold, applying the bias signal to the cells via the storage controller to reverse a resistance shift of the cells; and
      in response to the data access activity of neighboring cells, modifying at least one of the threshold and an amount of the bias signal.

17. The apparatus of claim 16, wherein the cells comprise phase change memory cells, and wherein the bias results in keeping the cells in a crystalline state.

18. The apparatus of claim 16, wherein the cells comprise resistive random access memory (RRAM) cells, and wherein the bias results in reversing an ion migration.

19. The method of claim 1, further comprising, in response to the second activity metric of the neighboring cells, applying a second bias signal to the neighboring cells, the second bias signal decaying as a function of distance from the cells.

20. The apparatus of claim 9, wherein the controller is further configured to perform, in response to the data access activity of neighboring cells, applying a second bias signal to the neighboring cells, the second bias signal decaying as a function of distance from the cells.

* * * * *